United States Patent [19]
MacQuigg

[11] Patent Number: 6,144,240
[45] Date of Patent: Nov. 7, 2000

[54] LOW NOISE BUFFER CIRCUIT FOR INCREASING DIGITAL SIGNAL TRANSITION SLEW RATES

[75] Inventor: David R. MacQuigg, Tucson, Ariz.

[73] Assignee: National Semiconductor Corporation, Santa Clara, Calif.

[21] Appl. No.: 09/323,308

[22] Filed: Jun. 1, 1999

[51] Int. Cl.[7] .................................................. H03K 5/12
[52] U.S. Cl. ............................................................. 327/170
[58] Field of Search .................................... 327/166, 170, 327/172–176, 182, 261, 263, 264, 276–278, 284, 285, 299

[56] References Cited

U.S. PATENT DOCUMENTS

| | | | |
|---|---|---|---|
| 4,806,802 | 2/1989 | Okitaka et al. | 307/542 |
| 4,841,166 | 6/1989 | Harnden | 307/246 |
| 5,453,709 | 9/1995 | Tanimoto et al. | 327/276 |
| 5,541,541 | 7/1996 | Salamina et al. | 327/108 |
| 5,731,727 | 3/1998 | Iwamoto et al. | 327/281 |
| 5,859,552 | 1/1999 | Do et al. | 327/170 |
| 5,973,533 | 10/1999 | Nagaoka | 327/263 |

*Primary Examiner*—My-Trang Nuton
*Attorney, Agent, or Firm*—Baker & McKenzie

[57] ABSTRACT

A low noise buffer circuit for increasing the slew rates of transitions between signal states of a digital signal while drawing minimal transient power supply current during such signal state transitions. Successive alternating digital signal inversion circuits conduct respective power supply source and sink currents which: are unregulated source currents and regulated sink currents during respective low-to-high output signal transitions; transition from unregulated source currents and regulated sink currents to regulated source currents and unregulated sink currents, respectively, during respective high output signal states; are regulated source currents and unregulated sink currents during respective high-to-low output signal transitions; and transition from regulated source currents and unregulated sink currents to unregulated source currents and regulated sink currents, respectively, during respective low output signal states.

23 Claims, 3 Drawing Sheets

LOW NOISE BUFFER CIRCUIT FOR INCREASING DIGITAL SIGNAL TRANSITION SLEW RATES

BACKGROUND OF THE INVENTION

1. Field of the Invention

The present invention relates to buffer circuits for digital signals, and in particular to low noise buffer circuits for increasing the slew rates of transitions between signal states of a digital signal while drawing minimal transient power supply current during such signal state transitions.

2. Description of the Related Art

With increasing diversity among the types of circuits which must coexist in the same integrated circuit, signal crosstalk, power supply transients and other forms of "noise" become more prevalent. For example, with both low noise analog circuits and logic circuits integrated on the same chip, problems often develop within the analog circuitry due to large transients being injected on the shared power supply and ground lines by the logic circuits. Complementary metal oxide semiconductor (CMOS) clock circuits are often among the worst offenders due to the large "shoot-through" currents conducted by the CMOS inverters which build up, or buffer, a small internal oscillator signal to a full rail-to-rail output signal.

Accordingly, it would desirable to have a buffer circuit suitable for use in mixed-signal integrated circuits which allows the slew rates of digital signal transitions to be significantly increased while drawing minimal transient power supply current during such signal state transitions.

SUMMARY OF THE INVENTION

In accordance with one embodiment of the present invention, a low noise buffer circuit for increasing the slew rates of transitions between signal states of a digital signal while drawing minimal transient power supply current during such signal state transitions includes digital signal inversion circuits, a current supply circuit and a control circuit. The digital signal inversion circuits are configured to conduct power supply source and sink currents and in accordance therewith receive and successively invert an input digital signal with input rising and falling edge slew rates and in accordance therewith provide an output digital signal with output rising and falling edge slew rates which are higher than the input rising and falling edge slew rates. The current supply circuit, coupled to the digital signal inversion circuits, is configured to receive current control signals and in accordance therewith convey the power supply source and sink currents. The control circuit, coupled to the digital signal inversion circuits and the current supply circuit, is configured to receive the output digital signal and in accordance therewith provide the current control signals. In accordance with the current control signals, successive alternating digital signal inversion circuits conduct respective power supply source and sink currents which: include unregulated source currents and regulated sink currents during respective low-to-high output signal transitions; transition from unregulated source currents and regulated sink currents to regulated source currents and unregulated sink currents, respectively, during respective high output signal states; include regulated source currents and unregulated sink currents during respective high-to-low output signal transitions; and transition from regulated source currents and unregulated sink currents to unregulated source currents and regulated sink currents, respectively, during respective low output signal states.

In accordance with another embodiment of the present invention, a low noise buffer circuit for increasing the slew rates of transitions between signal states of a digital signal while drawing minimal transient power supply current during such signal state transitions includes a current supply circuit, a control circuit and digital signal inversion circuits. The current supply circuit is configured to receive current control signals and in accordance therewith convey supply currents which include unregulated source currents, regulated source currents, unregulated sink currents and regulated sink currents. The control circuit, coupled to the current supply circuit, is configured to receive an output digital signal and in accordance therewith provide the current control signals. The digital signal inversion circuits, coupled to the current supply circuit and the control circuit, is configured to conduct the supply currents and in accordance therewith receive and successively invert an input digital signal with input rising and falling edge slew rates and in accordance therewith provide the output digital signal with output rising and falling edge slew rates which are higher than the input rising and falling edge slew rates. Each one of the digital signal inversion circuits conducts respective supply currents which: include an unregulated source current and a regulated sink current during a respective low-to-high output signal transition; transition from the unregulated source current and regulated sink current to a regulated source current and an unregulated sink current, respectively, during a respective high output signal state; include the regulated source current and unregulated sink current during a respective high-to-low output signal transition; and transition from the regulated source current and unregulated sink current to the unregulated source current and regulated sink current during a respective low output signal state.

These and other features and advantages of the present invention will be understood upon consideration of the following detailed description of the invention and the accompanying drawings.

DETAILED DESCRIPTION OF THE INVENTION

Figure 1:
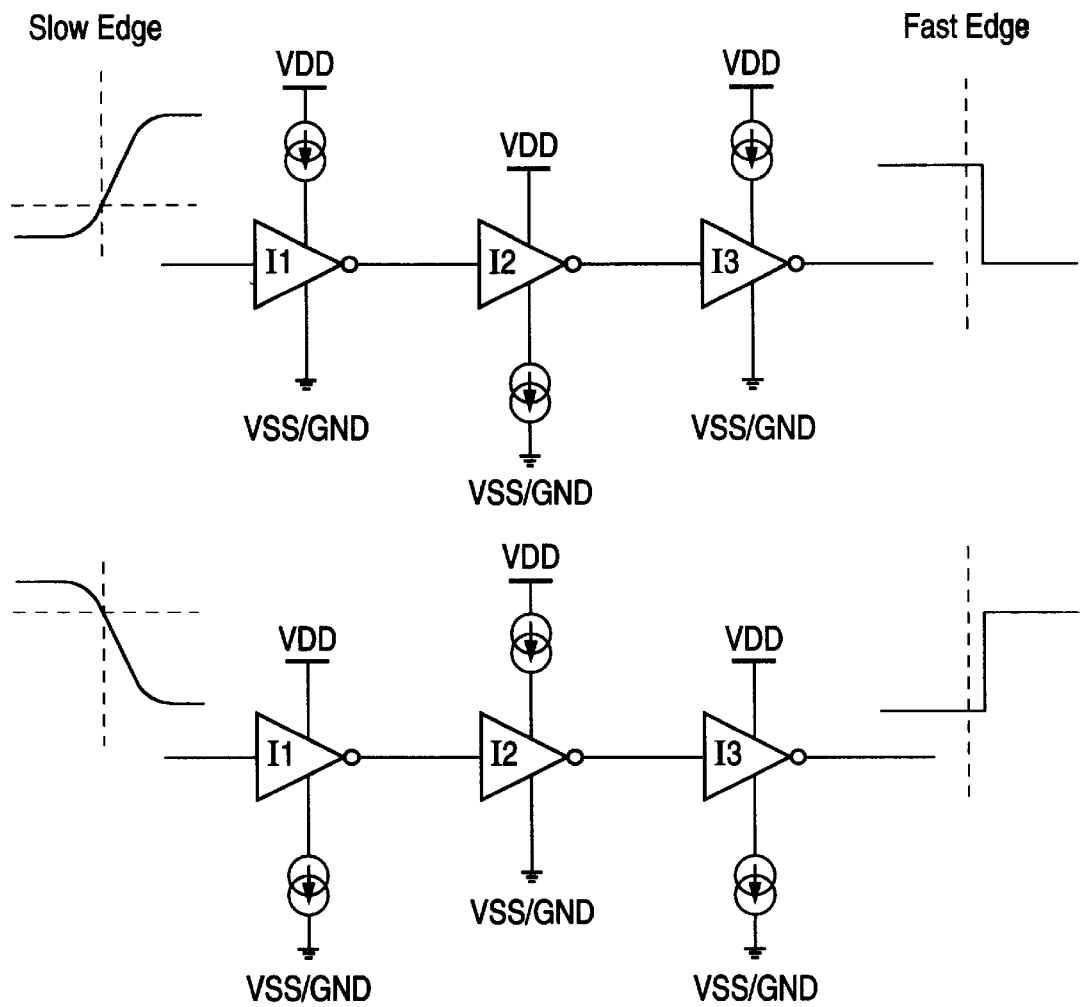
FIG. 1 contains functional block diagrams of a low noise buffer circuit in accordance with one embodiment of the present invention with the regulated and unregulated states of its power supply currents indicated for positive and negative signal state transitions.

Referring to FIG. 1, a low noise buffer circuit in accordance with one embodiment of the present invention operates in one of two basic states during the positive and negative signal state transitions of the input (or output) signal. For example, during a low-to-high signal state transition at the input, thereby causing a high-to-low digital signal transition state at the output (for a cascade of an odd number, e.g., three, of digital logic inverters), the oddly numbered digital logic inverter circuits I1, I3 are biased with regulated current source circuits and unregulated current sink circuits while the evenly numbered digital logic inverter circuit I2 is biased with an unregulated current source circuit and a regulated current sink circuit. Conversely, during a high-to-low digital signal state transition at the input (and a low-to-high digital signal state transition at the output), inverters I1 and I3 are biased with unregulated current source circuits and regulated current sink circuits while inverter I2 is biased with a regulated current source circuit and an unregulated current sink circuit.

Hence, when an input digital signal waveform with slow transitions, i.e., low slew rates (typically from an oscillator circuit), is applied to the input, the power supplies to the inverter circuits are set up to respond rapidly to the corresponding signal edges for each respective output on an inverter circuit. For example, when the input signal is transitioning from a low state to a high state, the power supplies are set up to have successive alternating inverter circuits provide rapid responses at their respective output terminals. Accordingly, since there is no direct unregulated DC current path through any of the inverters at such times, the typical "shoot-through" currents are prevented.

Figure 2A:
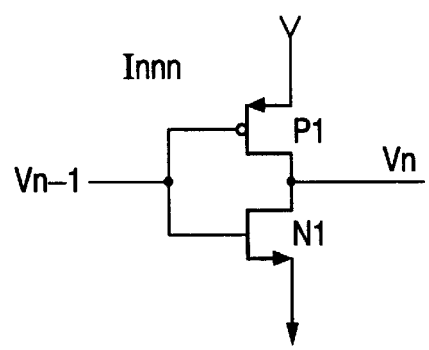
FIG. 2A is a schematic diagram for the logic inverters of the circuit of FIG. 2.
Figure 2:
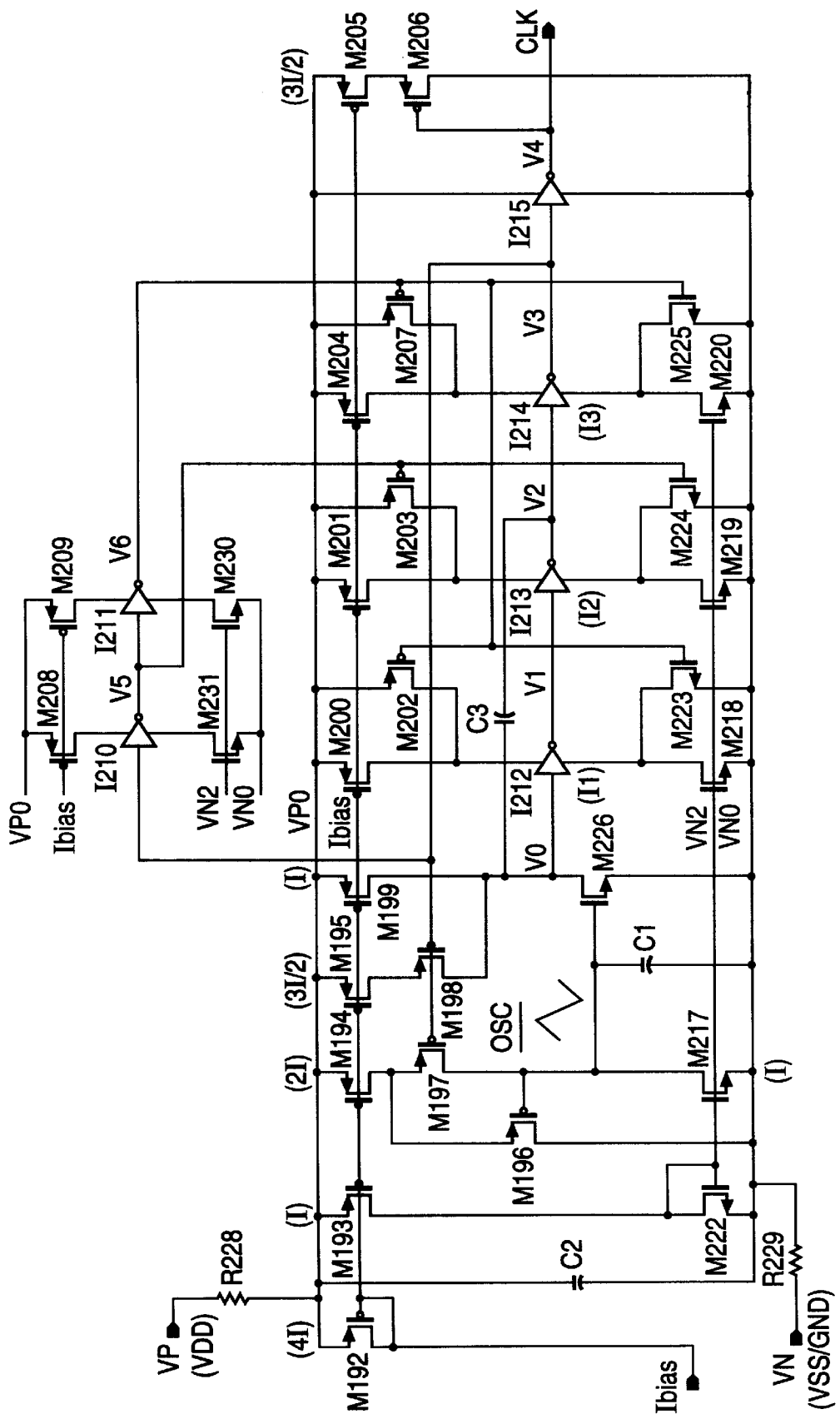
FIG. 2 is a schematic diagram of one embodiment of the circuit of FIG. 1.

Referring to FIG. 2, an example embodiment of the circuit of FIG. 1 for a 0.72 micron CMOS process is illustrated. In addition to inverter circuits I1 (I212), I2 (I213) and I3 (I214), an oscillator circuit OSC is shown for providing the input signal to the input inverter circuit I212 and an output inverter circuit I215 is used to buffer the output signal from inverter I214. Additionally, a control circuit in the form of two serially connected inverters I210, I211 is included for establishing the regulated and unregulated states of the current source and sink circuits for the primary inverter circuits I212, I213, I214.

This circuit has three inputs. Input VP is the positive power supply potential (VDD), while input VN is the negative power supply (VSS or ground). Input Ibias is a sinking current which is made available in another circuit elsewhere in the system (not shown) and is the reference current which drives the current mirror circuits formed by P-type MOS transistors M192–M195, M199–M201, M204 and M205 and N-type MOS transistors M217–M220 and M222.

The current mirror circuit devices M192–M195, M199–M201, M204, M205, M217–M220 and M222 generate regulated currents, both source and sink, based upon ratios from the input current Ibias. These current ratios are represented at the points where the various current sources connect to the internal power supply nodes VP0 and VN0. For example, as indicated, transistors M193 and M199 draw current I (e.g., I=Ibias) while transistors M194 and M192 draw currents 2I and 4I, respectively. Transistors M200–M204 and M207 draw no DC current per se, but instead draw brief transient current pulses during clock transitions. Transistors M195 and M205 draw a current of 3I with a 50% duty cycle.

Resistors R228 and R229 and capacitor C2 act as a power supply filter to minimize the amount of noise from power supply nodes VP0 and VN0 that reaches external power supply terminals VP and VN. This RC filter, while small when implemented in an integrated circuit environment, is nonetheless effective due to the minimal amount of current drawn by the buffer circuit, as will be described below.

Figure 3:
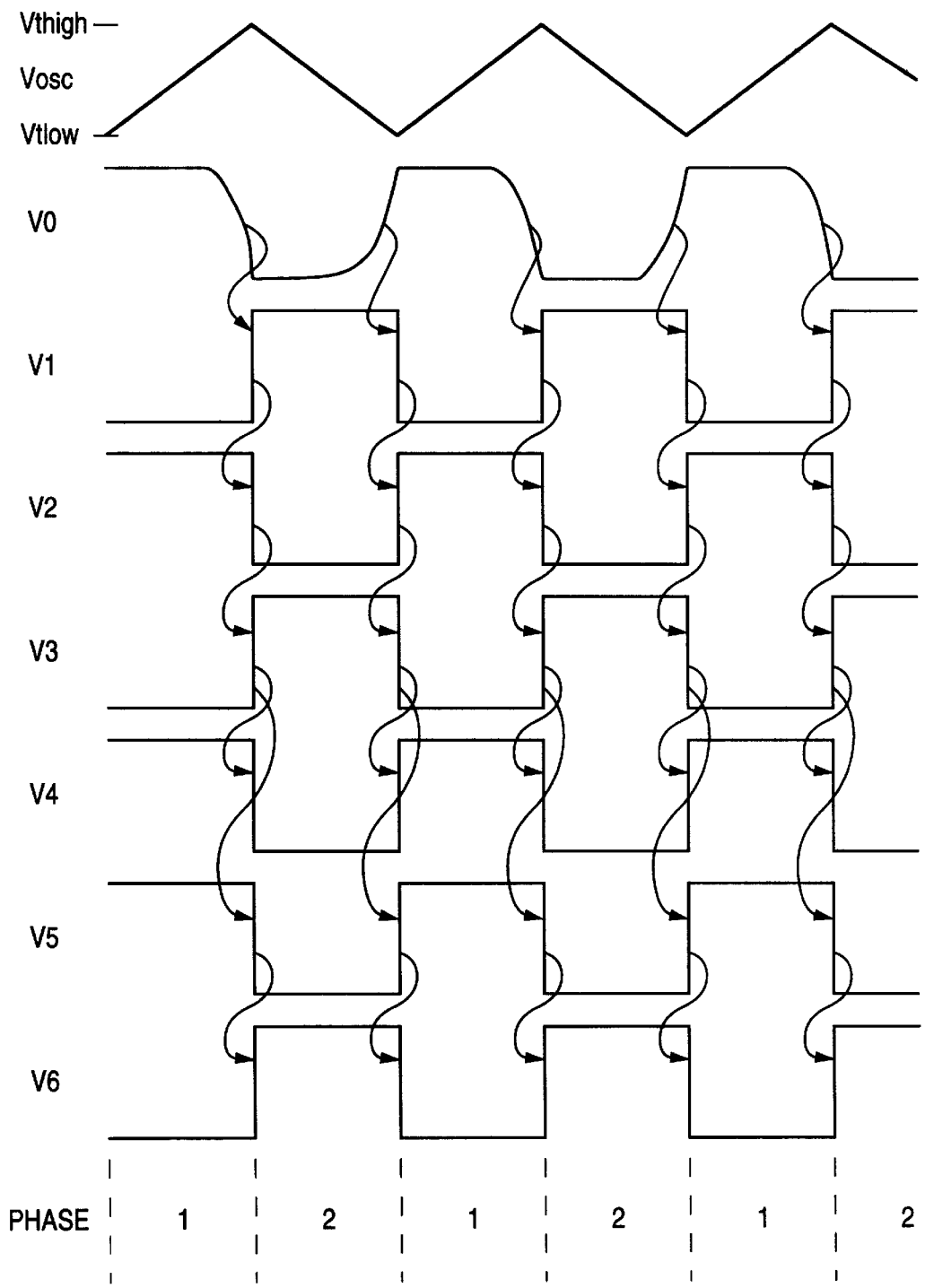
FIG. 3 is a signal timing diagram for the circuit of FIG. 2.

Referring to FIGS. 2 and 3 together, when the final clock output signal CLK (at node V4) is in a high state (Phase 1), oscillator transistors M197 and M198 are both turned on (due to the low voltage state of the signal at node V3). During this time, the total current to the integration capacitor C1 of the oscillator is +I (current 2I from transistor M194 less current I through transistor M217), the voltage across capacitor C1 is ramping positively and the total current available to the drain of transistor M226 is 4I. Conversely, i.e., when the output clock signal CLK is in a low voltage state (Phase 2), node V3 is at a high voltage state and transistors M197 and M198 are both turned off. Therefore, the total charging current to capacitor C1 is –I (due to a current I being sunk through transistor M217), the voltage across capacitor C1 is ramping negatively and the total current available to the drain of transistor M226 is I (via transistor M199).

During Phase 1, with the voltage at node V4 in a high state, the voltage at node V3 is in a low state, thereby causing the voltages at nodes V5 and V6 in the control circuit to be in high and low voltage states, respectively. Accordingly, transistors M202, M207 and M224 are turned on and transistors M223, M203 and M225 are turned off. This puts the circuit in the operational state represented in the lower circuit diagram of FIG. 1. In other words, during Phase 1, inverters I212 and I214 are biased with unregulated source current circuits (turned-on transistors M202 and M207) and regulated current sink circuits (current mirror transistors M218 and M220) while inverter circuit I213 is biased with a regulated current source circuit (current mirror M201) and an unregulated current sink circuit (turned-on transistor M224). Meanwhile, the voltages at nodes V1, V2 and V3 are in their low, high and low logic voltage states, respectively.

Near the end of Phase 1, the current into the drain of transistor M226 is rising. Upon reaching a value of 4I, the voltage V0 at the drain of transistor M226 begins to decrease and inverter I212 changes its output signal state from a logic low state to a logic high state. The turned-on state of transistor M202 allows an unregulated current to flow into node V1, the turned-on state of transistor M224 allows an unregulated sink current from node V2 to be sunk to node VN0, and the turned-on state of transistor M207 allows an unregulated source current to flow into node V3. (As shown in FIG. 2A, such a source current flows through P-MOS transistor P1 and such a sink current flows through N-MOS transistor N1 of the inverter circuit.) In turn, this causes the output inverter I215 to change state, thereby causing the output signal CLK at node V4 to snap from a logic high state to a logic low state, thereby entering Phase 2 of circuit operation. Feedback capacitor C3 accelerates these signal transitions by providing positive feedback from node V2 to the drain terminal of transistor M226.

Following this rapid transition from Phase 1 to Phase 2 of circuit operation, the voltages at node V5 and V6 change, i.e., from high and low states to low and high states, respectively. Accordingly, switch transistors M223, M203 and M225 are now turned on and switch transistors M202, M224 and M207 are now turned off. This places the circuit in the state of operation as depicted in the upper portion of FIG. 1. In other words, inverters I212 and I214 are biased with regulated current source circuits (current mirror transistors M200 and M204, respectively) and unregulated current sink circuits (turned-on transistors M223 and M225, respectively), while inverter circuit I213 is biased with an unregulated current source circuit (turned-on transistor M203) and a regulated current sink circuit (current mirror transistor M219). Accordingly, these serially connected inverter circuits I212–I215 are prepared to rapidly respond to a rising voltage V0 at the drain terminal of transistor M226. Once this voltage V0 has increased beyond the input threshold voltage of inverter circuit I212, unregulated currents are sunk from nodes V1 and V3 via turned-on transistors M223 and M225, respectively, while an unregulated source current is provided to node V2 via a turned-on transistor M203.

In this example, with an oscillator circuit consisting of transistors M196–M198, M226 and a capacitor C1 as depicted, the frequency of oscillation is determined by the current I, the value of the capacitor C1 and the difference between the upper Vthigh and lower Vtlow threshold voltages for transistor M226. In this example, the upper threshold voltage Vthigh is achieved when the drain current of transistor of M226 is 4I and the lower threshold voltage Vtlow is achieved when the drain current is I.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a low noise buffer circuit for increasing the slew rates of transitions between signal states of a digital signal while drawing minimal transient power supply current during said signal state transitions, comprising:

a plurality of digital signal inversion circuits configured to conduct a plurality of power supply source and sink currents and in accordance therewith receive and successively invert an input digital signal with input rising and falling edge slew rates and in accordance therewith provide an output digital signal with output rising and falling edge slew rates which are higher than said input rising and falling edge slew rates;

a current supply circuit, coupled to said plurality of digital signal inversion circuits, configured to receive a plurality of current control signals and in accordance therewith convey said plurality of power supply source and sink currents; and a control circuit, coupled to said plurality of digital signal inversion circuits and said current supply circuit, configured to receive said output digital signal and in accordance therewith provide said plurality of current control signals;

wherein, in accordance with said plurality of current control signals, successive alternating ones of said plurality of digital signal inversion circuits conduct respective ones of said plurality of power supply source and sink currents which include unregulated source currents and regulated sink currents during respective low-to-high output signal transitions, transition from said unregulated source currents and said regulated sink currents to regulated source currents and unregulated sink currents, respectively, during respective high output signal states, include said regulated source currents and said unregulated sink currents during respective high-to-low output signal transitions, and transition from said regulated source currents and said unregulated sink currents to said unregulated source currents and said regulated sink currents, respectively, during respective low output signal states.

2. The apparatus of claim 1, wherein said plurality of digital signal inversion circuits comprises a plurality of digital logic inverters.

3. The apparatus of claim 1, wherein said current supply circuit comprises:

a plurality of regulated current source circuits configured to receive one or more source control signals and in accordance therewith provide said regulated source currents;

a plurality of unregulated current source circuits configured to receive said plurality of current control signals and in accordance therewith provide said unregulated source currents;

a plurality of regulated current sink circuits configured to receive one or more sink control signals and in accordance therewith provide said regulated sink currents; and a plurality of unregulated current sink circuits configured to receive said plurality of current control signals and in accordance therewith provide said unregulated sink currents.

4. The apparatus of claim 3, wherein:

said plurality of regulated current source circuits comprises a first plurality of current mirror circuits; and said plurality of regulated current sink circuits comprises a second plurality of current mirror circuits.

5. The apparatus of claim 3, wherein:

said plurality of unregulated current source circuits comprises a plurality of source current switch circuits; and said plurality of unregulated current sink circuits comprises a plurality of sink current switch circuits.

6. The apparatus of claim 1, wherein said control circuit comprises a plurality of serially coupled digital signal inversion circuits.

7. The apparatus of claim 1, wherein:

said current supply circuit is further configured to provide a plurality of regulated power supply source and sink currents; and said control circuit is further configured to receive said plurality of regulated power supply source and sink currents and said output digital signal and in accordance therewith provide said plurality of current control signals.

8. The apparatus of claim 1, wherein:

said plurality of digital signal inversion circuits comprises an input digital signal inversion circuit, an output digital signal inversion circuit and an intermediate digital signal inversion circuit coupled between said input and output digital signal inversion circuits; and said apparatus further comprises an input terminal, coupled to said input digital signal inversion circuit, configured to convey said input digital signal, and a capacitive feedback circuit coupled between and capacitively coupling said intermediate digital signal inversion circuit and said input terminal.

9. The apparatus of claim 1, further comprising a signal generator circuit, coupled to said plurality of digital signal inversion circuits, configured to receive said output digital signal and in accordance therewith provide said input digital signal.

10. The apparatus of claim 9, wherein:

said current supply circuit is further configured to provide a plurality of regulated power supply source and sink currents; and said signal generator circuit is further coupled to said current supply circuit and is further configured to receive said plurality of regulated power supply source and sink currents and said output digital signal and in accordance therewith provide said input digital signal.

11. An apparatus including a low noise buffer circuit for increasing the slew rates of transitions between signal states of a digital signal while drawing minimal transient power supply current during said signal state transitions, comprising:

digital signal inversion means for conducting a plurality of power supply source and sink currents and in accordance therewith receiving and successively inverting an input digital signal with input rising and falling edge slew rates and in accordance therewith providing an output digital signal with output rising and falling edge slew rates which are higher than said input rising and falling edge slew rates;

current supply means, coupled to said digital signal inversion means, for receiving a plurality of current control signals and in accordance therewith conveying said plurality of power supply source and sink currents; and control means, coupled to said digital signal inversion means and said current supply means, for receiving said output digital signal and in accordance therewith providing said plurality of current control signals;

wherein, in accordance with said plurality of current control signals, successive alternating portions of said digital signal inversion means conduct respective ones of said plurality of power supply source and sink currents which include unregulated source currents and regulated sink currents during respective low-to-high output signal transitions, transition from said unregulated source currents and said regulated sink currents to regulated source currents and unregulated sink currents, respectively, during respective high output signal states, include said regulated source currents and said unregulated sink currents during respective high-to-low output signal transitions, and transition from said regulated source currents and said unregulated sink currents to said unregulated source currents and said regulated sink currents, respectively, during respective low output signal states.

12. The apparatus of claim 11, wherein said current supply means comprises:

regulated current source means for receiving one or more source control signals and in accordance therewith providing said regulated source currents;

unregulated current source means for receiving said plurality of current control signals and in accordance therewith providing said unregulated source currents;

regulated current sink means for receiving one or more sink control signals and in accordance therewith providing said regulated sink currents; and unregulated current sink means for receiving said plurality of current control signals and in accordance therewith providing said unregulated sink currents.

13. The apparatus of claim 11, wherein:

said current supply means is further for providing a plurality of regulated power supply source and sink currents; and said control means is further for receiving said plurality of regulated power supply source and sink currents and said output digital signal and in accordance therewith providing said plurality of current control signals.

14. The apparatus of claim 11, wherein:

said digital signal inversion means comprises input digital signal inversion means, output digital signal inversion means and intermediate digital signal inversion means coupled between said input and output digital signal inversion means; and said apparatus further comprises input means, coupled to said input digital signal inversion means, for conveying said input digital signal, and capacitive feedback means for capacitively coupling said intermediate digital signal inversion means and said input means.

15. The apparatus of claim 11, further comprising signal generator means, coupled to said digital signal inversion means, for receiving said output digital signal and in accordance therewith providing said input digital signal.

16. The apparatus of claim 15, wherein:

said current supply means is further for providing a plurality of regulated power supply source and sink currents; and said signal generator means is further coupled to said current supply means and is further for receiving said plurality of regulated power supply source and sink currents and said output digital signal and in accordance therewith providing said input digital signal.

17. An apparatus including a low noise buffer circuit for increasing the slew rates of transitions between signal states of a digital signal while drawing minimal transient power supply current during said signal state transitions, comprising:

a current supply circuit configured to receive a plurality of current control signals and in accordance therewith convey a plurality of supply currents which includes a plurality of unregulated source currents, a plurality of regulated source currents, a plurality of unregulated sink currents and a plurality of regulated sink currents;

a control circuit, coupled to said current supply circuit, configured to receive an output digital signal and in accordance therewith provide said plurality of current control signals;

a plurality of digital signal inversion circuits, coupled to said current supply circuit and said control circuit, configured to conduct said plurality of supply currents and in accordance therewith receive and successively invert an input digital signal with input rising and falling edge slew rates and in accordance therewith provide said output digital signal with output rising and falling edge slew rates which are higher than said input rising and falling edge slew rates, wherein each one of said plurality of digital signal inversion circuits conducts a respective portion of said plurality of supply currents which includes an unregulated source current and a regulated sink current during a respective low-to-high output signal transition, transitions from said unregulated source current and said regulated sink current to a regulated source current and an unregulated sink current, respectively, during a respective high output signal state, includes said regulated source current and said unregulated sink current during a respective high-to-low output signal transition, and transitions from said regulated source current and said unregulated sink current to said unregulated source current and said regulated sink current during a respective low output signal state.

18. The apparatus of claim 17, wherein said current supply circuit comprises:
- a plurality of source current mirror circuits configured to receive one or more source control signals and in accordance therewith provide said regulated source currents;
- a plurality of source current switch circuits, coupled across said plurality of source current mirror circuits, configured to receive said plurality of current control signals and in accordance therewith provide said unregulated source currents;
- a plurality of sink current mirror circuits configured to receive one or more sink control signals and in accordance therewith provide said regulated sink currents; and
- a plurality of sink current switch circuits, coupled across said plurality of sink current mirror circuits, configured to receive said plurality of current control signals and in accordance therewith provide said unregulated sink currents.

19. The apparatus of claim 17, wherein said control circuit comprises a plurality of serially coupled digital signal inversion circuits.

20. The apparatus of claim 17 wherein:
- said current supply circuit is further configured to provide a plurality of regulated power supply source and sink currents; and
- said control circuit is further configured to receive said plurality of regulated power supply source and sink currents and said output digital signal and in accordance therewith provide said plurality of current control signals.

21. The apparatus of claim 17, wherein:
- said plurality of digital signal inversion circuits comprises an input digital signal inversion circuit, an output digital signal inversion circuit and an intermediate digital signal inversion circuit coupled between said input and output digital signal inversion circuits; and
- said apparatus further comprises
  - an input terminal, coupled to said input digital signal inversion circuit, configured to convey said input digital signal, and
  - a capacitive feedback circuit coupled between and capacitively coupling said intermediate digital signal inversion circuit and said input terminal.

22. The apparatus of claim 17, further comprising a signal generator circuit, coupled to said plurality of digital signal inversion circuits, configured to receive said output digital signal and in accordance therewith provide said input digital signal.

23. The apparatus of claim 22, wherein:
- said current supply circuit is further configured to provide a plurality of regulated power supply source and sink currents; and
- said signal generator circuit is further coupled to said current supply circuit and is further configured to receive said plurality of regulated power supply source and sink currents and said output digital signal and in accordance therewith provide said input digital signal.

* * * * *